(12) United States Patent
Liaw

(10) Patent No.: US 7,257,017 B2
(45) Date of Patent: Aug. 14, 2007

(54) SRAM CELL FOR SOFT-ERROR RATE REDUCTION AND CELL STABILITY IMPROVEMENT

(75) Inventor: Jhon-Jhy Liaw, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 198 days.

(21) Appl. No.: 10/926,769

(22) Filed: Aug. 26, 2004

(65) Prior Publication Data

US 2005/0265070 A1    Dec. 1, 2005

Related U.S. Application Data

(60) Provisional application No. 60/575,217, filed on May 28, 2004.

(51) Int. Cl.
*G11C 11/00* (2006.01)
(52) U.S. Cl. .................. 365/154; 365/149; 365/104
(58) Field of Classification Search ................ 365/154
See application file for complete search history.

(56) References Cited

U.S. PATENT DOCUMENTS

| 4,750,155 | A  * | 6/1988 | Hsieh ..................... 365/203 |
| 4,821,233 | A  * | 4/1989 | Hsieh ..................... 365/203 |
| 6,341,083 | B1 * | 1/2002 | Wong ..................... 365/154 |
| 6,510,076 | B1   | 1/2003 | Lapadat et al. |
| 2005/0023633 | A1 * | 2/2005 | Yeo et al. ................ 257/500 |

* cited by examiner

*Primary Examiner*—Thong Q. Le
(74) *Attorney, Agent, or Firm*—Slater & Matsil, L.L.P.

(57) ABSTRACT

An SRAM device includes a memory cell. The memory cell includes a first cross-coupled inverter and a second cross-coupled inverter, which is electrically connected to the first cross-coupled inverter. Each inverter includes a pull down device and a pull up device. The pull up device is electrically connected to the pull down device. A channel width ratio of the pull up device to the pull down device is preferably within a range of about 1.5 to about 0.8. A channel area ratio of the pull up device to the pull down device is preferably within a range of about 3 to about 1. A pass gate device is electrically connected to the pull down device. A channel width ratio of the pull up device to the pass gate device is preferably within a range of about 3.0 to about 1.2.

54 Claims, 8 Drawing Sheets

SRAM CELL FOR SOFT-ERROR RATE REDUCTION AND CELL STABILITY IMPROVEMENT

This application claims priority to Provisional Application Ser. No. 60/575,217, filed on May 28, 2004, and entitled "SRAM Cell for Soft-Error Rate Reduction and Cell Stability Improvement", which application is hereby incorporated herein by reference.

TECHNICAL FIELD

The present invention relates generally to a system and method for providing semiconductor devices, and more particularly to a system and method for providing a static random access memory (SRAM) cell for soft-error rate reduction and cell stability improvement.

BACKGROUND

Complementary metal-oxide-semiconductor (CMOS) technology is the dominant semiconductor technology used for the manufacture of ultra-large scale integrated (ULSI) circuits today. Size reduction of the semiconductor structures has provided significant improvement in the speed, performance, circuit density, and cost per unit function of semiconductor chips over the past few decades. Significant challenges, however, are faced as the sizes of CMOS devices continue to decrease.

One such challenge is soft errors. Soft errors are errors that occur in the logic state of a circuit due to excess charge carriers, which are typically induced by alpha-particles and cosmic ray neutrons. As the excess charge carriers are induced into a circuit, the logic values may be altered. For example, a logic value of a capacitor or line may be altered from a logic "0" to a logic "1," transistor gates may be turned off or on, or the like. Soft errors occurring in SRAM devices or other memory devices can cause the stored data to become corrupted.

Attempts have been made to limit the effect of excess charge carriers and soft errors on integrated circuits. One such attempt involves the addition of error-correcting circuitry (ECC). Another attempt involves lowering the size ratio for the pull up device to pull down device sizes to below 0.75, in order to provide cell size reduction. These attempts, however, generally require additional circuitry, additional processing, and increased power requirements. Such requirements may adversely affect the design and fabrication of more robust memory circuits. Hence, a need exists for ways to reduce or eliminate soft errors in a semiconductor device and improve memory cell stability in an SRAM device.

SUMMARY OF THE INVENTION

These and other problems are generally solved or circumvented, and technical advantages are generally achieved, by preferred embodiments of the present invention which provide an SRAM cell for soft-error rate reduction and cell stability improvement.

In accordance with one aspect of the present invention, an SRAM device is provided, which device includes a memory cell. The memory cell includes a first inverter and a second inverter. The output node of the first inverter is electrically connected to an input node of the second inverter, and an output node of the second inverter is electrically connected to an input node of the first inverter. Each comprises a pull down device and a pull up device. A drain node of the pull down device is electrically connected to a drain node of the pull up device. A channel width ratio of the pull up device to the pull down device is within a range of about 1.5 to about 0.8.

In accordance with another aspect of the present invention, an SRAM device is provided, which device includes a memory cell. The memory cell includes a first inverter and a second inverter. An output node of the first inverter is electrically connected to an input node of the second inverter, and an output node of the second inverter is electrically connected to an input node of the first inverter. Each inverter includes a pull down device and a pull up device. A drain node of the pull down device is electrically connected to a drain node of the pull up device. A pass gate device is electrically connected to the pull down device, wherein a channel width ratio of the pull up device to the pass gate device is within a range of about 3 to about 1.2.

In accordance with still another aspect of the present invention, a method of manufacturing an SRAM device is provided, which method includes forming a memory cell. The step of forming a memory cell includes forming a first cross-coupled inverter and forming a second cross-coupled inverter so that the second cross-coupled inverter is electrically connected to the first cross-coupled inverter by a storage node. The forming step of each of the inverters includes forming a pull down device and forming a pull up device so that the pull up device is electrically connected to the pull down device. A channel width ratio of the pull up device to the pull down device is within a range of about 1.5 to about 0.8.

In accordance with yet another aspect of the present invention, a method of manufacturing an SRAM device is provided, which method includes forming a memory cell. The step of forming a memory cell includes forming a first cross-coupled inverter and forming a second cross-coupled inverter. The second cross-coupled inverter is electrically connected to the first cross-coupled inverter by a storage node. The step of forming each of the inverters includes forming a pull down device and forming a pull up device so that the pull up device is electrically connected to the pull down device. A channel area ratio of the pull up device to the pull down device is within a range of about 3 to about 1.

In accordance with still yet another aspect of the present invention, a method of manufacturing an SRAM device is provided, which method includes forming a first cross-coupled inverter, forming a second cross-coupled inverter, and electrically connecting the first cross-coupled inverter to the second cross-coupled inverter by a storage node. Each inverter comprises a pull down device. The method further includes forming a pass gate device electrically connected to the pull down device by a storage node. A channel width ratio of the pull up device to the pass gate device is within a range of about 3 to about 1.2.

In accordance with yet another aspect of the present invention, a method of manufacturing an SRAM device is provided, which method includes forming a memory cell. The step of forming a memory cell includes forming a first cross-coupled inverter and forming a second cross-coupled inverter electrically connected to the first cross-coupled inverter. Each inverter comprises a pull down device. The method described in this paragraph further includes forming a pass gate device electrically connected to the pull down device by a storage node. A channel area ratio of the pull up device to the pass gate device is within a range of about 3.5 to about 1.25.

In accordance with yet another aspect of the present invention, an SRAM device is provided, which device includes a memory cell. The memory cell includes a first cross-coupled inverter, a second cross-coupled inverter electrically connected to the first cross-coupled inverter, wherein each inverter comprises a pull down device, a pull up device electrically connected to the pull down device, and a pass gate device electrically connected to the pull down device, wherein a channel width ratio of the pull up device to the pull down device is within a range of about 1.5 to about 0.8, and wherein a channel width ratio of the pull up device to the pass gate device is within a range of about 3.0 to about 1.2.

In accordance with still yet another aspect of the present invention, an SRAM device is provided, which device includes a memory cell. The memory cell includes a first cross-coupled inverter and a second cross-coupled inverter electrically connected to the first cross-coupled inverter. Each inverter comprises a pull down device and a pull up device electrically connected to the pull down device. A pass gate device is electrically connected to the pull down device. A channel area ratio of the pull up device to the pull down device is within a range of about 3 to about 1. A channel area ratio of the pull up device to the pass gate device is within a range of about 3.5 to about 1.25.

In accordance with yet another aspect of the present invention, an SRAM device is provided, which device includes a memory cell. The memory cell includes a first cross-coupled inverter and a second cross-coupled inverter electrically connected to the first cross-coupled inverter. Each inverter comprises a pull down device and a pull up device electrically connected to the pull down device. A pass gate device is electrically connected to the pull down device. A channel width ratio of the pull up device to the pull down device is within a range of about 1.5 to about 0.8, a channel width ratio of the pull up device to the pass gate device is within a range of about 3.0 to about 1.2, a channel area ratio of the pull up device to the pull down device is within a range of about 3 to about 1, and a channel area ratio of the pull up device to the pass gate device is within a range of about 3.5 to about 1.25.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
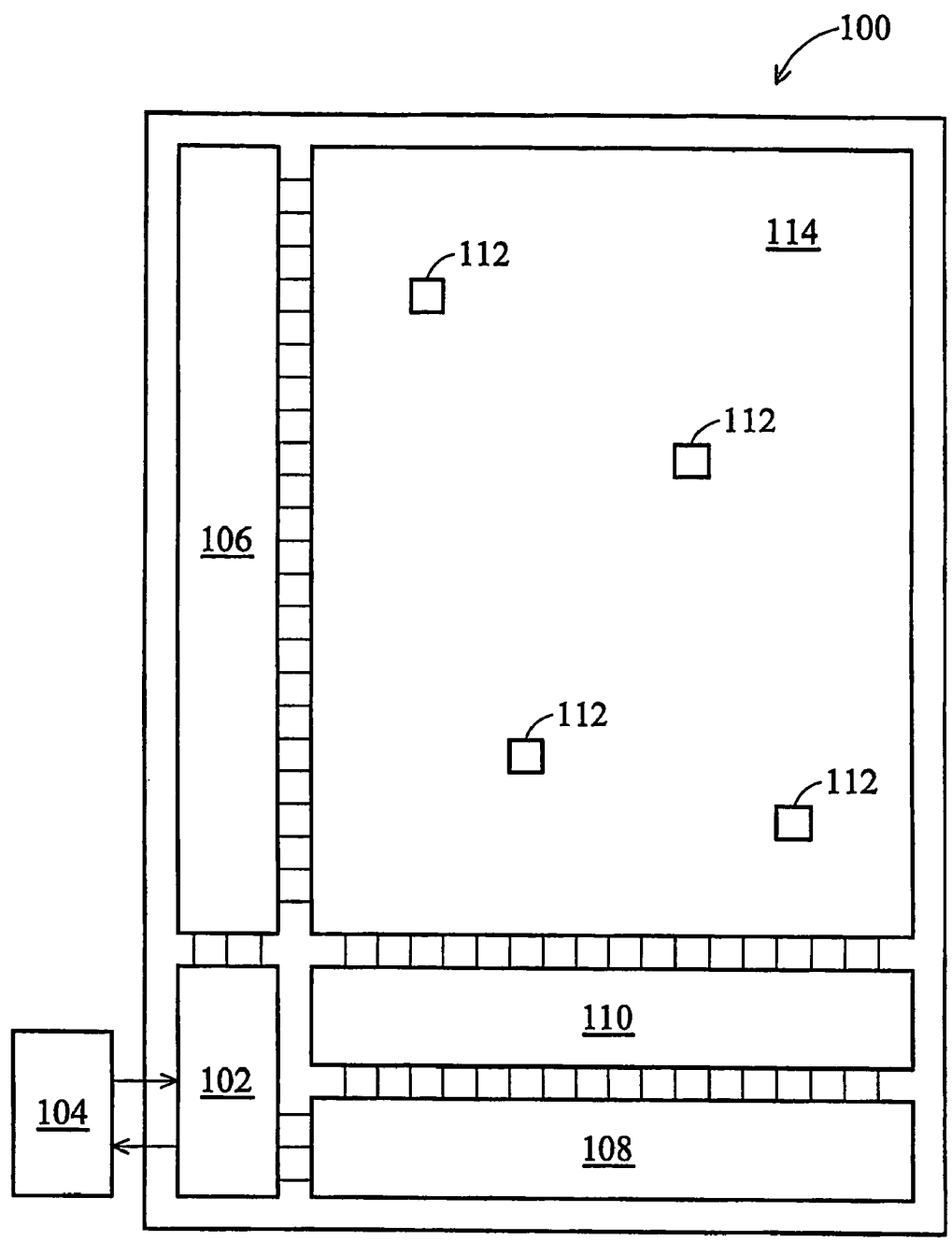
FIG. 1 is a simplified diagram of a conventional SRAM chip.
Figure 2:
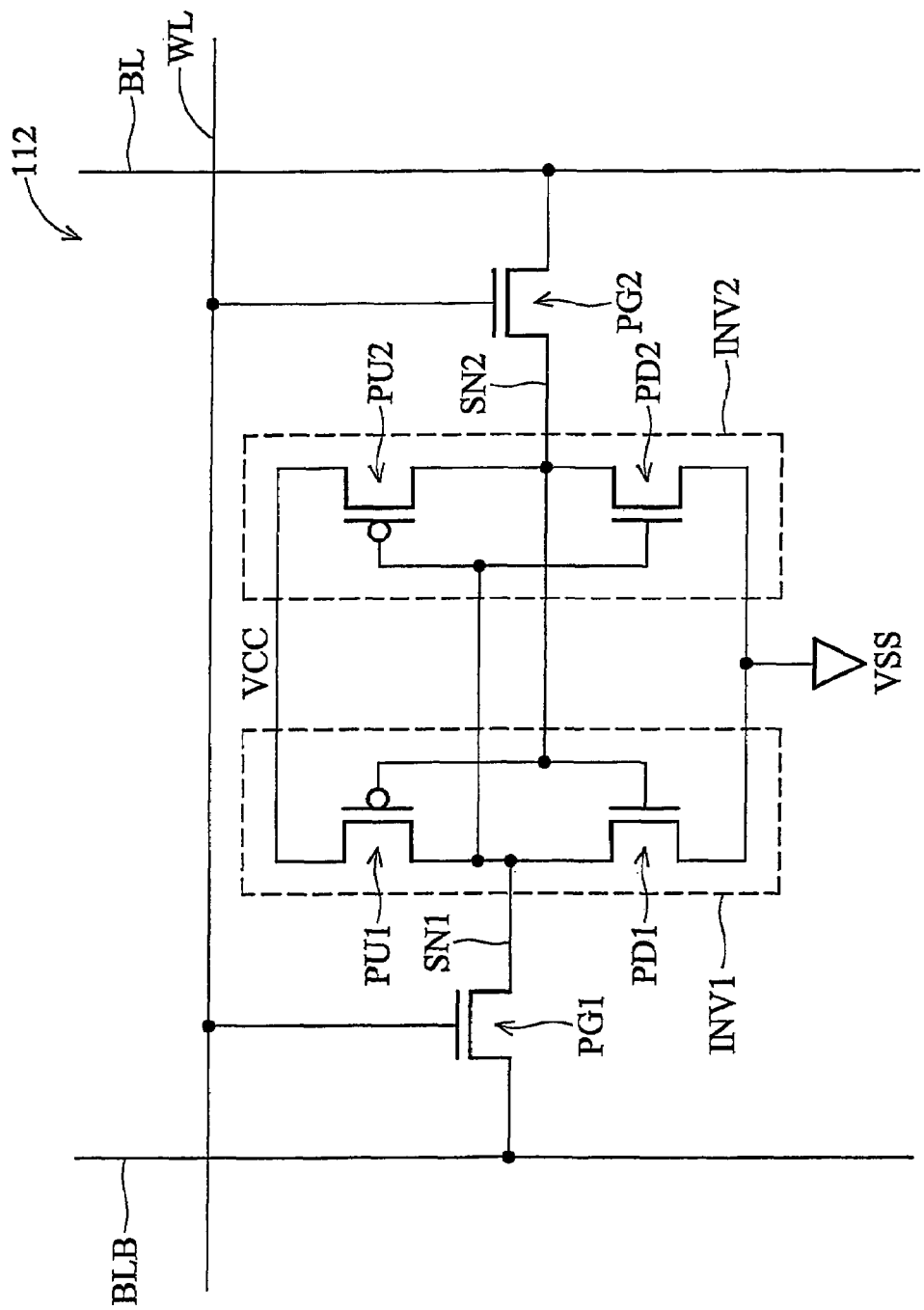
FIG. 2 is a transistor-level schematic of a conventional six transistor SRAM cell.

The present invention will be described with respect to illustrative embodiments in a specific context, namely an SRAM cell for soft-error rate reduction and cell stability improvement. With reference to FIG. 1, a system level schematic of a conventional SRAM integrated circuit (IC) 100 is shown. A control block 102 interfaces with devices 104 outside the SRAM device 100. The control block 102 also interfaces with various blocks inside the SRAM device 100, including the row decoder 106, the column decoder 108, and the sense amplifier/driver block 110. The control block 102 operates the row decoder 106 and the sense amplifier/driver block 110 to gain read and write access to individual cells 112 from the two dimensional memory cell array 114. The memory cell array 114 has a large number of memory cells 112, e.g., billions, millions, or hundreds of thousands. FIG. 2 shows a schematic view of a conventional memory cell 112 in a memory array 114, which may be part of the SRAM device 100 of FIG. 1, for example.

The memory cell 112 shown in FIG. 2 is a six transistor (6T) SRAM memory cell. Alternatively, the memory cells 112 in the memory array 114 (shown in FIG. 1) may be other types of SRAM cells including 5 transistor (5T), 8 transistor (8T), 10 transistor (10T), 12 transistor (12T), 14 transistor (14T), CAM cell, and combinations thereof, for example.

Figure 3:
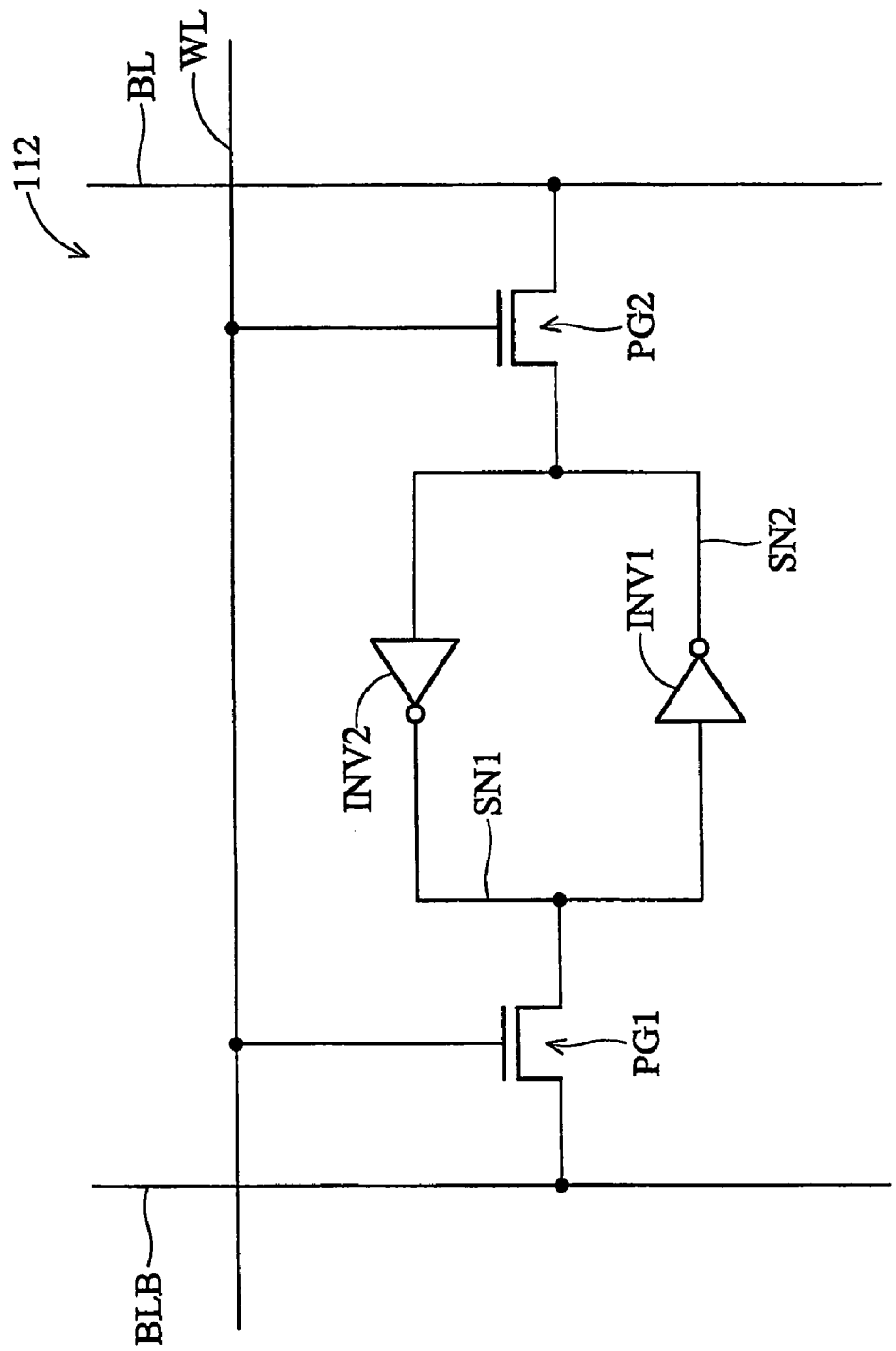
FIG. 3 is a schematic of a conventional six transistor SRAM cell with logic symbols.

Referring again to FIG. 2, two p-channel pull up transistors PU1 and PU2 are coupled to two n-channel pull down transistors PD1 and PD2 to form cross-coupled inverters INV1 and INV2. FIG. 3 shows a schematic of FIG. 2 with the cross-coupled inverters INV1 and INV2 shown as logic symbols. FIG. 3 shows storage nodes SN1 and SN2 formed where the pass gate transistors PG1 and PG2, respectively, are interconnected with the cross-coupled inverters INV1 and INV2. The storage nodes SN1 and SN2 each preferably have a capacitance less than about 1.5 femto-farad. During operation, the storage nodes SN1 and SN2 have complimentary voltages representing a logic one and a logic zero. A logic one is typically a designated positive operating voltage (e.g., about 1.5 volts, and about 0.8 volts).

Figure 4:
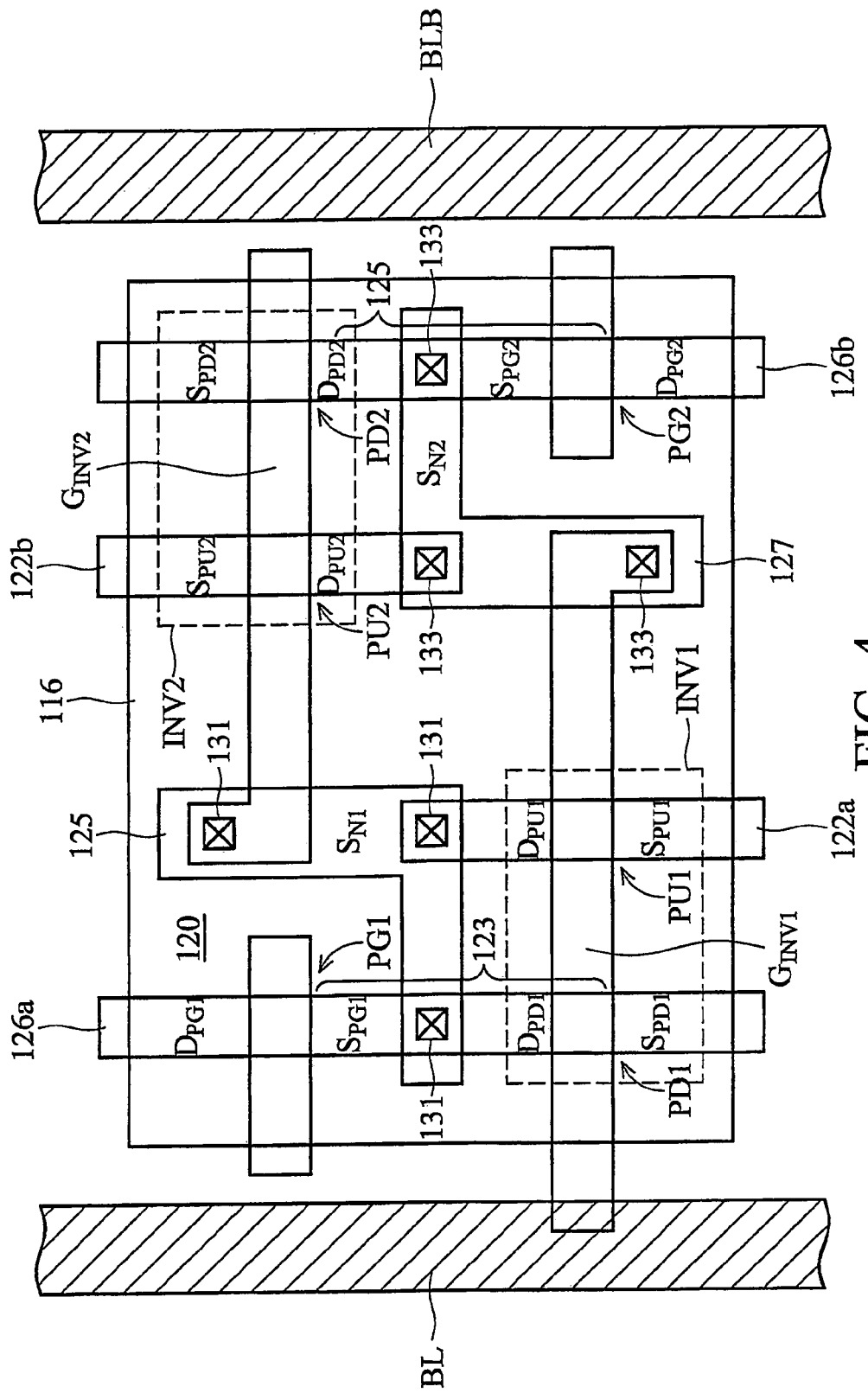
FIGS. 4-6 are layout views in accordance with the first, second, third, and fourth illustrative embodiments of the present invention.
Figure 5:
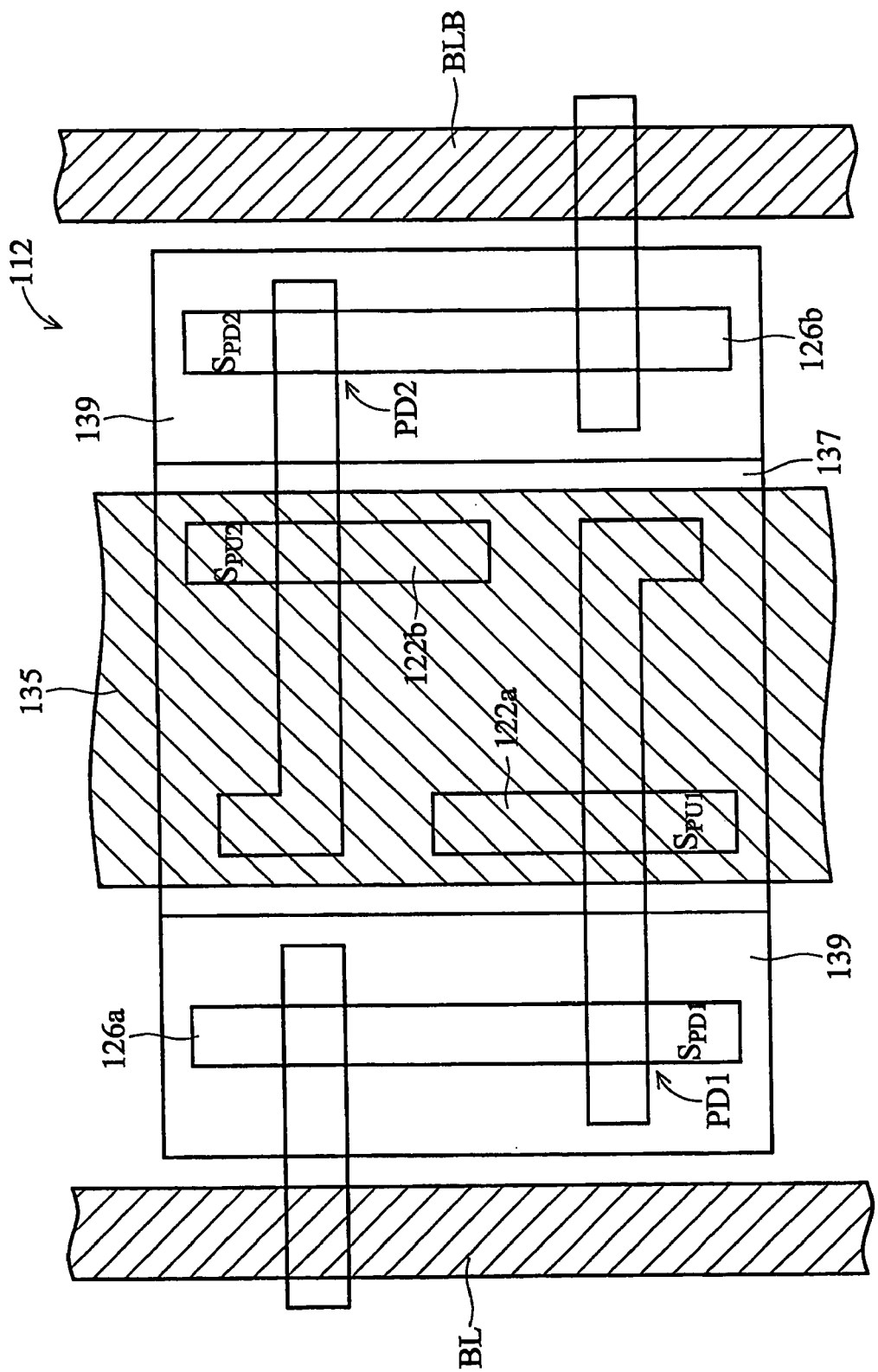
Figure 6:
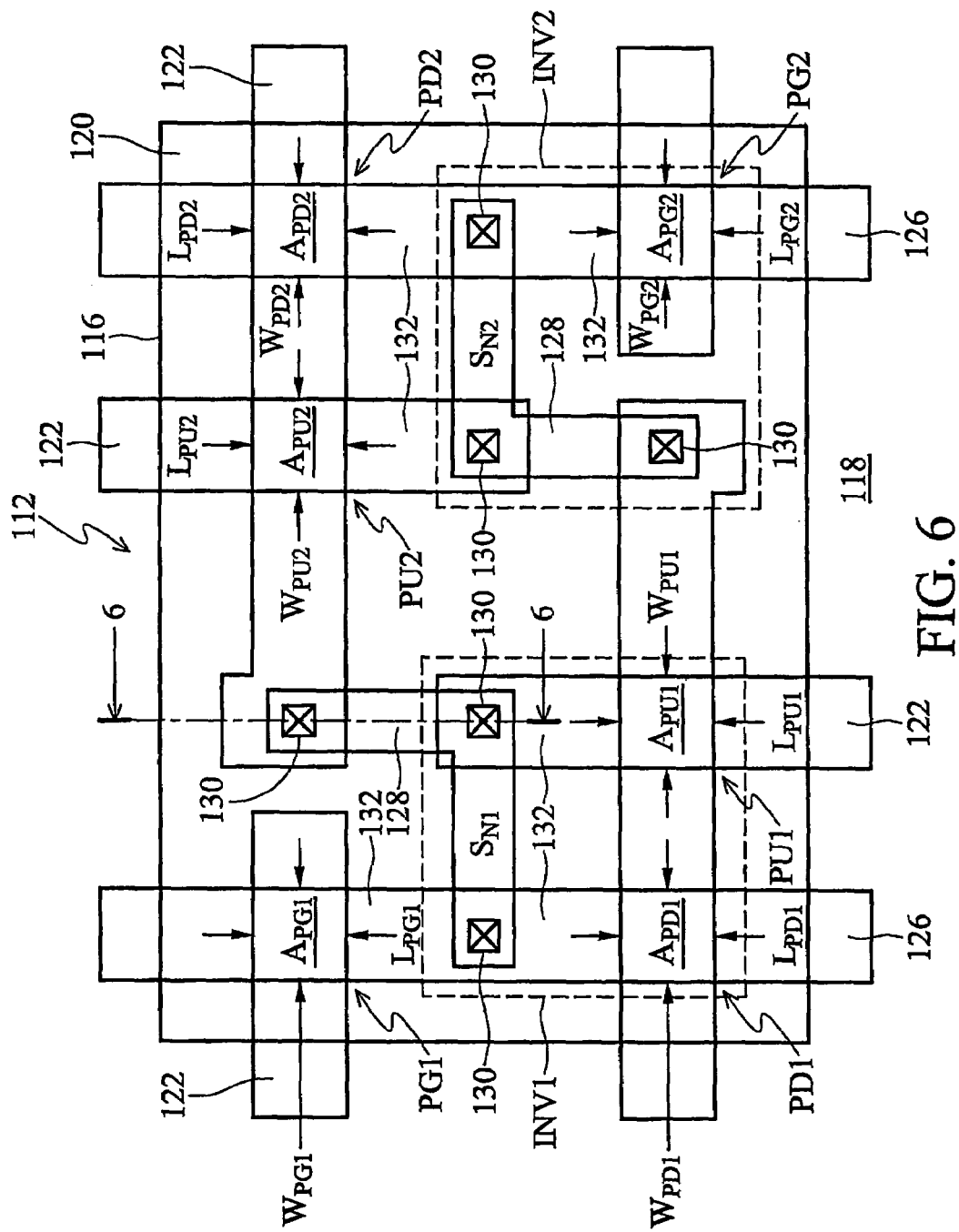

FIGS. 4, 5, and 6 show overhead views of a physical layout of a 6T SRAM cell 112 in accordance with the first, second, third, and fourth illustrative embodiments of the present invention. However, the elements shown in FIGS. 4, 5 and 6 may be limited to the objects relevant to discussion, and one skilled in the art will recognize that other objects formed in various ways will supplement the layouts shown, as is known in the art. Furthermore, some of the objects in FIG. 4 may not be readily apparent in the finished product, such as the cell boundary line 116. The first, second, third, and fourth illustrative embodiments are discussed below following a description of portions of the memory cell structure 112, which is similar in each embodiment.

Referring to FIG. 4, the cell boundary line 116 encloses an area 120 of the chip surface occupied by the 6T SRAM cell 112. The cell area 120 of the 6T SRAM cell 112 is preferably less than about 2 um$^2$, for example. Alternatively, the cell area 120 may be smaller or larger depending on various factors, including the SRAM cell type. For example, the cell area for an 8T SRAM cell in another illustrative embodiment is preferably less than about 3 um$^2$.

N-channel metal oxide semiconductor (NMOS) transistors PG1, PD1, PG2, and PD2, are formed in the memory cell area 120 where gate structures overlie n-diffusion regions 126. P-channel metal oxide semiconductor (PMOS)

transistors PU1 and PU2, are formed in the memory chip area 120 where gate structures overlie p-diffusion regions 122.

The polysilicon wire $G_{INV1}$ overlying the p-diffusion region 122a and overlying the n-diffusion region 126a is the gate of inverter INV1. The polysilicon wire $G_{INV2}$ overlying the p-diffusion region 122b and the n-diffusion region 126b, is the gate of inverter INV2. Contacts 131 and a metal wire 125 electrically connect the drain node $D_{PD1}$ of the pull down transistor PD1, the drain node $D_{PU1}$ of the pull up transistor PU1, and the gate node $G_{INV2}$ of the cross-coupled inverter INV2. Contacts 133 and a metal wire 127 electrically connect the drain node $D_{PD2}$ of the pull down transistor PD2, the drain node $D_{PU2}$ of the pull up transistor PU2, and the gate node $G_{INV1}$ of the cross-coupled inverter INV1. The inverters INV1 and INV2 are considered cross-coupled because the input of inverter INV1 is electrically connected to the output of inverter INV2 and the input of inverter INV2 is electrically connected to the output of inverter INV1.

The source node $S_{PG1}$ of the pass gate transistor PG1 is electrically connected to the drain node $D_{PU1}$ of the pull up transistor PU1 in the shared diffusion region 123. It should be noted that while the terms source and drain are used to designate a region of a transistor in illustrative embodiments of the present invention, the source and drain are generally interchangeable and should be considered so herein. The drain node $D_{PG1}$ of the pass gate device PG1 is electrically connected to the bit line wire BL. The source node $S_{PG2}$ of the pass gate device PG2 is electrically connected to the drain node $D_{PU2}$ of the pull up transistor PU2 by the shared diffusion region 125. The drain node $D_{PG2}$ of the transistor PU2 is electrically connected to a bit line bar wire BLB.

Reference is now made to FIG. 5. The source nodes $S_{PD1}$ and $S_{PD2}$ of the pull down devices PD1 and PD2, respectively, are electrically connected to a memory cell ground supply (not shown) defined as Vss. Vss is typically about zero volts, for example. Although referred to herein as Vss, the ground supply to the memory cell 112 may also be referred to as DVSS, GND, DGND, or the memory cell low voltage, for example. The source nodes $S_{PU1}$ and $S_{PU2}$ of the pull up devices PU1 and PU2 are electrically connected to a voltage supply source (not shown) having a voltage defined as Vcc. The static voltage of Vcc may range between about 0.5 volts and about 1.8 volts, for example. During operation and in different temperatures, the voltage level Vcc may range as much as 30% above or below Vcc. The voltage supplied to the memory cell 112 preferably has a minimum voltage less than about 0.9 volts. Although the voltage supply is herein referred to as Vcc, the operating voltage of the memory cell 112 may also be referred to as DVDD, VDD, or the memory cell high voltage, for example.

The memory cell 112 in FIG. 5 has an N-well region interposed between two P-well regions. The bit line wire and the bit line bar wire, the P-well region and the N-well regions are all substantially aligned in a direction. A voltage supply wire 135 is interposed between the bit line wire BL and the bit line bar BLB wire on the same metal layer. The voltage supply wire 135 carries a voltage of Vcc.

With reference now to FIG. 6, a first embodiment of the present invention is shown. The channel width ratio of the pull up device channel width $W_{PU1}$ to the pull down transistor channel width $W_{PD1}$ is within a range of about 1.5 to about 0.8. Also in the first embodiment, the channel width ratio of the pull up device channel width $W_{PU2}$ to the pull down transistor channel width $W_{PD2}$ is also within a range of about 1.5 to about 0.8.

In accordance with a second illustrative embodiment of the present invention, an SRAM has 6T SRAM cells 112 with a channel area ratio of the pull up transistor channel area $A_{PU1}$ to the pull down transistor channel area $A_{PD1}$ within a range of about 3 to about 1. The same channel area ratio exists between the pull up transistor channel area $A_{PU2}$ and the pull down transistor channel area $A_{PD2}$ (see FIG. 4). Generally, the channel area of a transistor $A_x$ is the channel length of the transistor $L_x$ multiplied by the channel width of the transistor $W_x$.

In accordance with a third illustrative embodiment of the present invention, also shown in FIG. 4, the channel width ratio of the pull up transistor channel width $W_{PU1}$ to the pass gate transistor channel width $P_{G1}$ is within a range of about 3 to about 1.2. The same range of ratios applies to the channel width ratio of the pull up transistor channel width $W_{PU2}$ and the pass gate transistor channel width $W_{PG2}$ in the third embodiment.

In accordance with a fourth illustrative embodiment of the present invention as shown in FIG. 4, the channel area ratio of the pull up transistor channel area $A_{PU1}$ to the pass gate transistor channel area $A_{PG1}$ is within a range of about 3.5 to about 1.25. The same range of ratios applies to the channel area ratio of the pull up transistor channel area $A_{PU2}$ to the pass gate transistor channel area $A_{PG2}$ in the fourth embodiment.

It is recognized that the first, second, third, and fourth illustrative embodiments may be combined in any suitable manner that optimizes memory cell performance. For example, a channel area ratio of about 1.75 may be applied between the channel areas $A_{PU1}$ to $A_{PG1}$, as well as the channel areas $A_{PU2}$ to $A_{PG2}$. In the same memory cell, a channel width ratio of about 1.25 may exist between the channel widths $W_{PU1}$ to $W_{PD1}$, and the channel widths $W_{PU2}$ to $W_{PD2}$.

Figure 7:
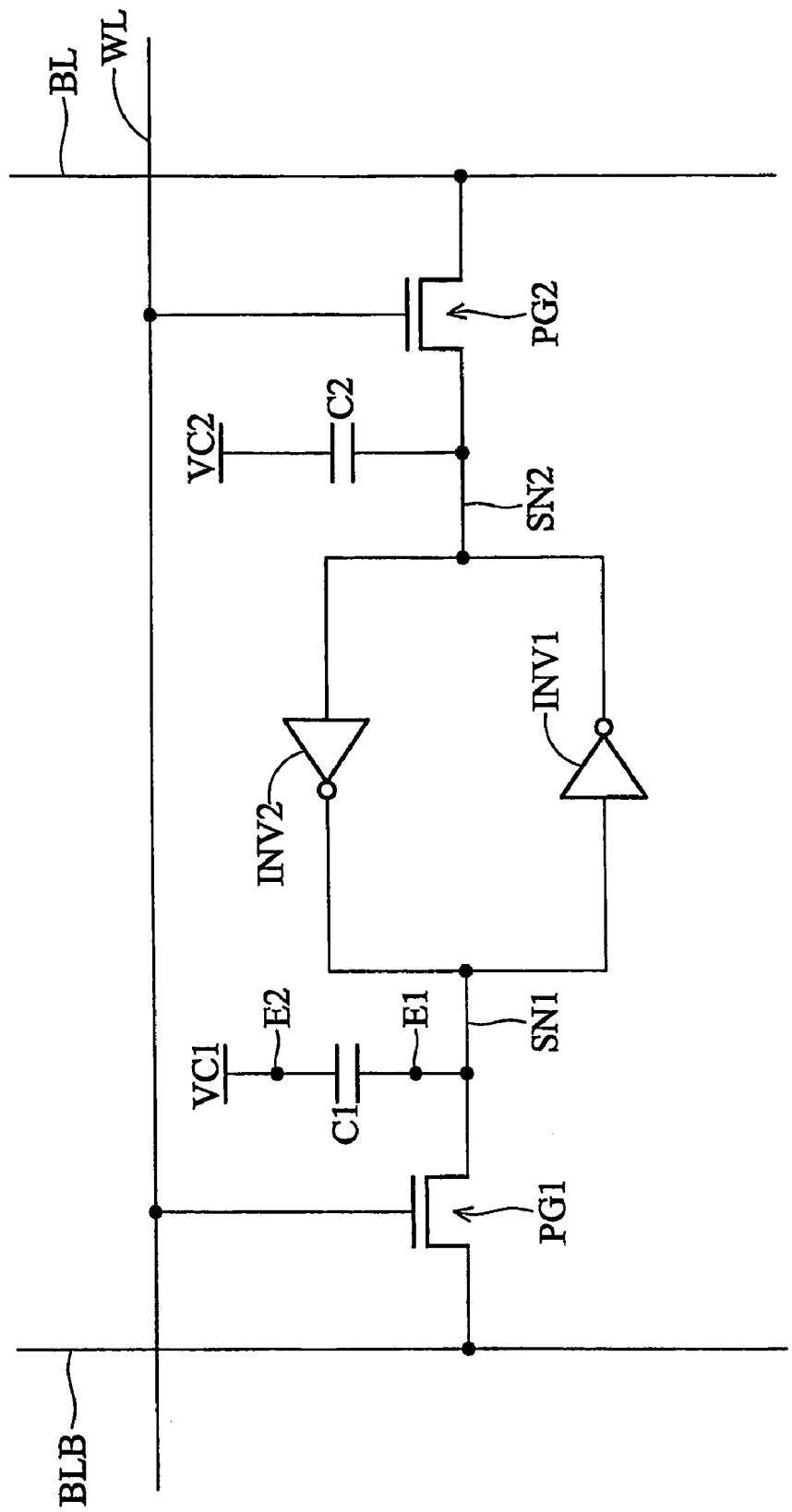
FIG. 7 is a schematic view of the fifth illustrative embodiment.

With reference to FIG. 7, a fifth illustrative embodiment includes an SRAM memory cell 112 similar to those shown in FIGS. 2 through 4. However, as shown in FIG. 5, the memory cell 112 of the fifth embodiment has a capacitor C1 electrically connected to the storage node SN1 and a capacitor C2 electrically connected to the storage node SN2. Illustrative embodiments preferably include SRAM memory cells having one capacitor electrically connected to each storage node.

Figure 8:
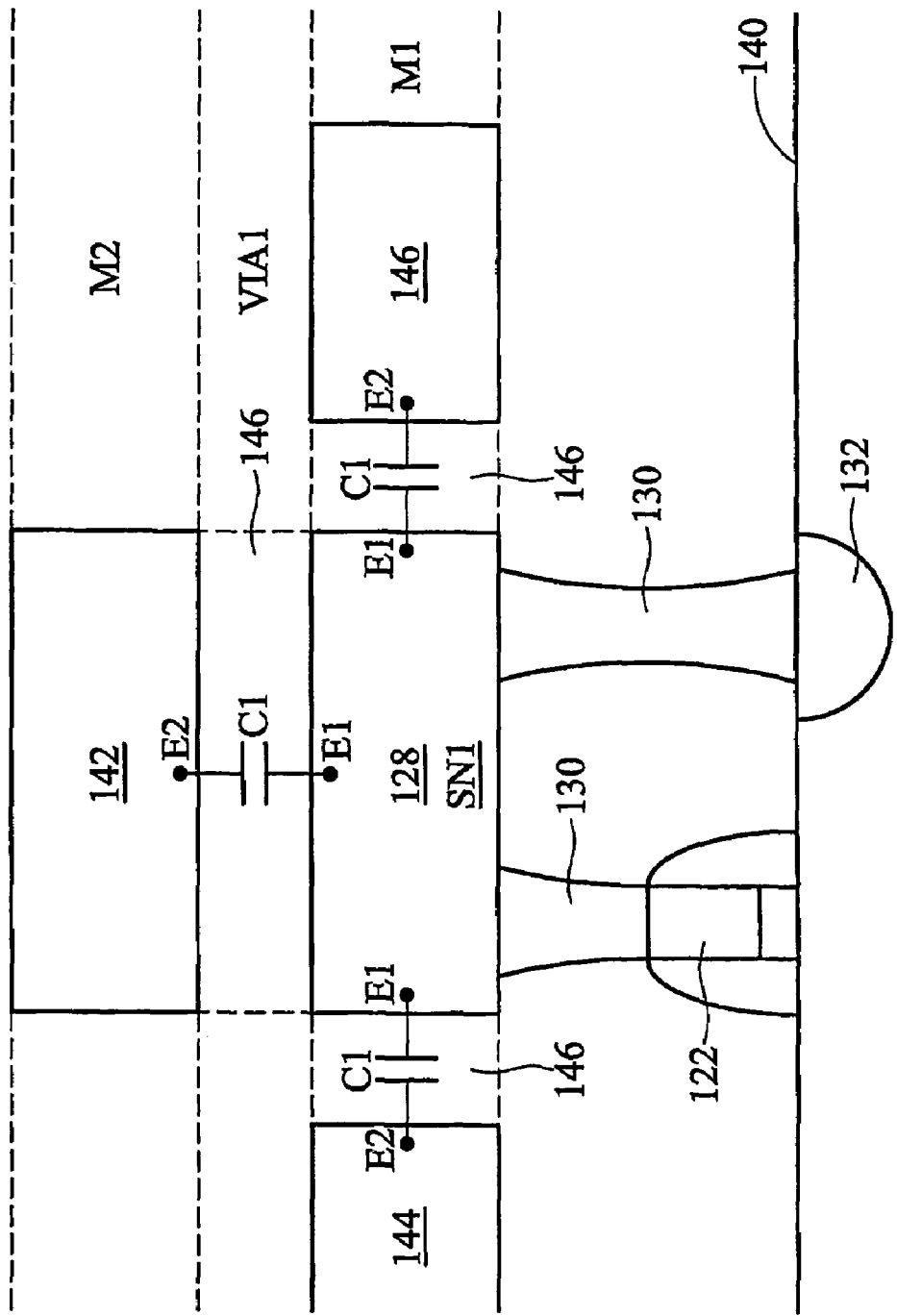
FIG. 8 is a cross section showing a portion of an SRAM cell of the fifth illustrative embodiment.

A cross section along the line 6-6 in FIG. 6 is shown in FIG. 8. With combined reference to FIGS. 6, 7 and 8, the fifth illustrative embodiment will be further described. The first electrode E1 of the capacitor C1 is the metal wire 128 at the node SN1. The metal wire 128 is preferably a copper wire on the first layer of metal M1 overlying the substrate surface 140. The metal wire 128 may alternatively be a buried interconnect or a butted contact, for example. Placing a copper wire 142 on a second metal layer M2 and over the copper wire 128 forms a second electrode E2. Alternatively, the second electrode E2 may be a wire formed adjacent the copper wire 128, as shown with wires 144 and 146. A dielectric material (e.g., silicon dioxide, $Si_3N_4$ and high K dielectric) forms the capacitor dielectric 146. The second electrode E2 is coupled to a voltage source $V_{C1}$, which may have a voltage in the range of about 0 volts (i.e., Vss) to about 1.5 volts (i.e., Vcc), for example. A capacitor C2 may be coupled to the storage node SN2 in the same way described above for connecting capacitor C1 to the storage node SN1. The amount of capacitance in the capacitor C2 is preferably coterminous with the amount of capacitance in the capacitor C1. Alternatively, the capacitances may vary to provide a desired or optimum performance of the SRAM cell 112.

The capacitor may include any suitable dielectric material, including (but not limited to) SiON, $Si_3N_4$, $Ta_2O_5$, $Al_2O_3$, PEOX, TEOS, nitrided oxide, oxide comprising hafnium, oxide comprising tantalum, oxide comprising aluminum, a high K material having a dielectric constant greater than about 5, and combinations thereof, for example. The dielectric material may also be a layer of oxide containing nitrogen. The first electrode and the second electrode of the capacitor may be any suitable material including (but not limited to) tungsten, aluminum, aluminum copper, silicide, titanium, titanium silicide, cobalt, cobalt silicide, nickel, nickel silicide, titanium nitride, titanium-tungsten, tantalum nitride, and combinations thereof, for example. In an illustrative embodiment of the present invention, the SRAM may be surrounded by a deep N-well region.

A first advantage of the illustrative embodiments may be the stabilization of SRAM cell operation with respect to read disturb immunity. This may be achieved by providing a higher width ratio of pull up to pull down devices in the cross-coupled inverters of the SRAM cell. A second advantage of the illustrative embodiments may be a higher soft error rate (SER) immunity. Forming wider pull up devices adds capacitance to the storage nodes in memory cells. Electrically connecting a capacitor to each storage node provides additional capacitance to the storage nodes. The capacitance in each storage node provides a constant charging in each storage node, causing each storage node to discharge over a longer period of time. The longer discharging time may significantly decrease the soft error rate (SER).

Although the present invention and its advantages have been described in detail, it should be understood that various changes, substitutions and alterations can be made herein without departing from the spirit and scope of the invention as defined by the appended claims. It will be readily understood by those skilled in the art that an SRAM cell for soft-error rate reduction and cell stability improvement may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An SRAM device comprising:
   a memory cell comprising
      a substrate;
      a first cross-coupled inverter; and
      a second cross-coupled inverter, wherein an output node of said first cross-coupled inverter is electrically connected to an input node of said second cross-coupled inverter, wherein an output node of said second cross-coupled inverter is electrically connected to an input node of said first cross-coupled inverter, and wherein each inverter comprises
      a pull down device, and
      a pull up device formed at least partially within the substrate, wherein a drain node of said pull down device is electrically connected to a drain node of said pull up device, and wherein a channel width ratio of said pull up device to said pull down device is within a range of about 1.5 to about 0.8.

2. The SRAM device of claim 1, wherein said electrical connection between said first cross-coupled inverter and said second cross-coupled inverter is a storage node having a capacitance less than about 1.5 femto-farad.

3. The SRAM device of claim 1, wherein said memory cell is further adapted to operate with a minimum operation voltage of less than about 0.8 volts.

4. The SRAM device of claim 1, wherein said memory cell is a 6T SRAM cell having an area less than about 2 $\mu m^2$.

5. The SRAM device of claim 1, wherein said memory cell is an 8T SRAM cell having an area less than about 3 $\mu m^2$.

6. The SRAM device of claim 1, further comprising a deep N-well region at least partially surrounding said memory cell.

7. The SRAM device of claim 1, wherein said memory cell is an SRAM cell selected from the group consisting of a 5 transistor SRAM cell, a 6 transistor SRAM cell, an 8 transistor SRAM cell, a 10 transistor SRAM cell, a 12 transistor SRAM cell, a 14 transistor SRAM cell, a CAM cell, and combinations thereof.

8. The SRAM device of claim 1, wherein said electrical connections between said first cross-coupled inverter and said second cross coupled inverter are a storage node and a storage node bar, and wherein said memory cell further comprises a first capacitor electrically connected to said storage node and a second capacitor electrically connected to said storage node bar.

9. The SRAM device of claim 8, wherein said capacitor comprises:
   a first electrode comprising a first conductive material;
   a second electrode comprising a second conductive material; and
   an interposed dielectric located between said first and second electrodes.

10. The SRAM device of claim 9, wherein said first electrode is coupled to said storage node and said second electrode is coupled to a voltage source.

11. The SRAM device of claim 9, wherein said dielectric comprises a material selected from the group consisting of SiON, $Si_3N_4$, $Ta_2O_5$, $Al_2O_3$, PEOX, TEOS, nitrided oxide, oxide comprising hafnium, oxide comprising tantalum, oxide comprising aluminum, a high K material having a dielectric constant greater than about 5, and combinations thereof.

12. The SRAM device of claim 9, wherein said first electrode comprises a first electrode material selected from the group consisting of tungsten, aluminum, aluminum copper, copper, silicide, titanium, titanium silicide, cobalt, cobalt silicide, nickel, nickel silicide, titanium nitride, titanium-tungsten, tantalum nitride, and combinations thereof, and wherein said second electrode comprises a second electrode material selected from the group consisting of tungsten, aluminum, aluminum copper, copper, silicide, titanium, titanium silicide, cobalt, cobalt silicide, nickel, nickel silicide, titanium nitride, titanium-tungsten, tantalum nitride, and combinations thereof.

13. The SRAM device of claim 1, wherein a drain node of said pull down device of said first cross-coupled inverter and a gate node of said second cross-coupled inverter are electrically connected to each other via a contact and a metal wire.

14. The SRAM device of claim 1, wherein a drain node of said pull down device of said second cross-coupled inverter and a gate node of said first cross-coupled inverter are electrically connected to each other via a contact and a metal wire.

15. The SRAM device of claim 1, wherein a source node of said pull down device is electrically connected to a memory cell low voltage, and a source node of said pull up device is electrically connected to a memory cell high voltage.

16. The SRAM device of claim 1, further comprising:
a first pass gate device;
a second pass gate device;
a bit line wire; and
a bit line bar wire,
  wherein a source node of said first pass gate device is electrically connected to a drain node of said pull up device in said first inverter,
  wherein a drain node of said first pass gate device is electrically connected to said bit line wire,
  wherein a source node of said second pass gate device is electrically connected to a drain node of said pull up device in said second inverter, and
  wherein a drain node of said second pass gate device is electrically connected to said bit line bar wire.

17. The SRAM device of claim 16, further comprising an N-well region interposed between two P-well regions.

18. The SRAM device of claim 17, wherein said bit line wire, said bit line bar wire, said P-well region, and said N-well regions are all substantially aligned in a first direction.

19. The SRAM device of claim 16, further comprising a third wire interposed between said bit line wire and said bit line bar wire on a first metal layer, wherein said third wire is electrically connected to a device adapted to provide said memory cell with an operating voltage.

20. The SRAM device of claim 1, further comprising a channel area ratio of said pull up device to said pull down device, wherein said channel area ratio is within a range of about 3 to about 1.

21. An SRAM device comprising:
a memory cell comprising
a substrate;
a first cross-coupled inverter;
  a second cross-coupled inverter, wherein an output node of said first cross-coupled inverter is electrically connected to an input node of said second cross-coupled inverter, wherein an output node of said second cross-coupled inverter is electrically connected to an input node of said first cross-coupled inverter via a storage node, and wherein each inverter comprises
    a pull down device; and
    a pull up device having a source and drain region located at least partially within the substrate, wherein a drain node of said pull down device is electrically connected to a drain node of said pull up device; and
  a pass gate device electrically connected to said pull down device, wherein a channel width ratio of said pull up device to said pass gate device is within a range of about 3 to about 1.2.

22. The SRAM device of claim 21, wherein said electrical connection between said first cross-coupled inverter and said second cross-coupled inverter is a storage node having a capacitance less than about 1.5 femto-farad.

23. The SRAM device of claim 21, wherein said memory cell is further adapted to operate with a minimum operation voltage of less than about 0.8 volts.

24. The SRAM device of claim 21, wherein said memory cell is a 6T SRAM cell having an area less than about 2 $\mu m^2$.

25. The SRAM device of claim 21, wherein said memory cell is an 8T SRAM cell having an area less than about 3 $\mu m^2$.

26. The SRAM device of claim 21, further comprising a deep N-well region at least partially surrounding said memory cell.

27. The SRAM device of claim 21, wherein said memory cell is an SRAM cell selected from the group consisting of a five transistor SRAM cell, a six transistor SRAM cell, an eight transistor SRAM cell, a ten transistor SRAM cell, a twelve transistor SRAM cell, a fourteen transistor SRAM cell, a CAM cell, and combinations thereof.

28. The SRAM device of claim 21, wherein said electrical connections between said first cross-coupled inverter and said second cross-coupled inverter are a storage node and a storage node bar, and wherein said memory cell further comprises a first capacitor electrically connected to said storage node and a second capacitor electrically connected to said storage node bar.

29. The SRAM device of claim 28, wherein said capacitor comprises:
a first electrode comprising a first conductive material;
a second electrode comprising a second conductive material; and
an interposed dielectric located between said first and second electrodes, wherein said first electrode is electrically connected to said storage node and said second electrode is electrically coupled to a voltage source.

30. The SRAM device of claim 29, wherein said dielectric comprises a material selected from the group consisting of SiON, $Si_3N_4$, $Ta_2O_5$, $Al_2O_3$, PEOX, TEOS, nitrided oxide, oxide comprising hafnium, oxide comprising tantalum, oxide comprising aluminum, a high K material having a dielectric constant greater than about 5, and combinations thereof.

31. The SRAM device of claim 29, wherein said first electrode comprises a first electrode material selected from the group consisting of tungsten, aluminum, aluminum copper, copper, silicide, titanium, titanium silicide, cobalt, cobalt silicide, nickel, nickel silicide, titanium nitride, titanium-tungsten, tantalum nitride, and combinations thereof, and
  wherein said second electrode comprises a second electrode material selected from the group consisting of tungsten, aluminum, aluminum copper, copper, silicide, titanium, titanium silicide, cobalt, cobalt silicide, nickel, nickel silicide, titanium nitride, titanium-tungsten, tantalum nitride, and combinations thereof.

32. The SRAM device of claim 21, wherein a drain node of said pull down device of said first cross-coupled inverter and a gate node of said second cross-coupled inverter are electrically connected to each other via a contact and a metal wire.

33. The SRAM device of claim 21, wherein a drain node of said pull down device of said second cross-coupled inverter and a gate node of said first cross-coupled inverter are electrically connected to each other via a contact and a metal wire.

34. The SRAM device of claim 21, wherein a source node of said pull down device is electrically connected to a memory cell low voltage and a source node of said pull up device is electrically connected to a memory cell high voltage.

35. The SRAM device of claim 21, further comprising:
a first pass gate device;
a second pass gate device;
a bit line wire; and
a bit line bar wire,
wherein a source node of said first pass gate device is electrically connected to a drain node of said pull up device in said first inverter,
wherein a drain node of said first pass gate device is electrically connected to said bit line wire,
wherein a source node of said second pass gate device is electrically connected to a drain node of said pull up device in said second inverter, and
wherein a drain node of said second pass gate device is electrically connected to said bit line bar wire.

36. The SRAM device of claim 35, further comprising:
an N-well with the pull up devices formed therein;
a first P-well region with the first pull down device and the first pass gate device formed therein; and
a second P-well region with the second pull down device and the second pass gate device formed therein.

37. The SRAM device of claim 36, wherein said bit line wire, said bit line bar wire, said P-well region, and said N-well regions are all substantially aligned in a first direction.

38. The SRAM device of claim 35, further comprising a third wire interposed between said bit line wire and said bit line bar wire on a first metal layer, wherein said third wire electrically connects the first and second pull up devices to a voltage source adapted to provide said memory cell with an operating voltage.

39. The SRAM device of claim 21, further comprising a channel area ratio of said pull up device to said pass gate device, wherein said channel area ratio is within a range of about 3.5 to about 1.25.

40. A method of manufacturing an SRAM device comprising:
forming a memory cell, wherein said forming of said memory cell comprises
forming a first cross-coupled inverter, and
forming a second cross-coupled inverter so that said second cross-coupled inverter is electrically connected to said first cross-coupled inverter by a storage node, wherein said forming each of said inverters comprises
forming a pull down device, and
forming a pull up device so that said pull up device is electrically connected to said pull down device, and so that a channel width ratio of said pull up device to said pull down device is within a range of about 1.5 to about 0.8.

41. The method of claim 40, further comprising:
forming a first capacitor so that the first capacitor is electrically connected to said storage node.

42. The method of claim 40, further comprising:
forming a deep N-well region at least partially surrounding said memory cell.

43. A method of manufacturing an SRAM device comprising:
forming a memory cell, wherein said forming of said memory cell comprises
forming a first cross-coupled inverter, and
forming a second cross-coupled inverter so that said second cross-coupled inverter is electrically connected to said first cross-coupled inverter by a storage node, wherein said forming each of said inverters comprises
forming a pull down device, and
forming a pull up device so that said pull up device is electrically connected to said pull down device, wherein a channel area ratio of said pull up device to said pull down device is within a range of about 3 to about 1.

44. The method of claim 43, further comprising:
forming a first capacitor so that the first capacitor is electrically connected to said storage node.

45. The method of claim 43, further comprising:
forming a deep N-well region at least partially surrounding said memory cell.

46. A method of manufacturing an SRAM device comprising the steps of:
forming a memory cell comprising
forming a first cross-coupled inverter, and
forming a second cross-coupled inverter electrically connected to said first cross-coupled inverter by a storage node, wherein each inverter comprises a pull down device, and
forming a pass gate device electrically connected to said pull down device by a storage node, wherein a channel width ratio of said pull up device to said pass gate device is within a range of about 3 to about 1.2.

47. The method of claim 46, further comprising:
forming a first capacitor so that the first capacitor is electrically connected to said storage node.

48. The method of claim 46, further comprising:
forming a deep N-well region at least partially surrounding said memory cell.

49. A method of manufacturing an SRAM device comprising the steps of:
forming a memory cell comprising
forming a first cross-coupled inverter;
forming a second cross-coupled inverter electrically connected to said first cross-coupled inverter, wherein each inverter comprises a pull down device; and
forming a pass gate device electrically connected to said pull down device by a storage node, wherein a channel area ratio of said pull up device to said pass gate device is within a range of about 3.5 to about 1.25.

50. The method of claim 49, further comprising:
forming a first capacitor so that the first capacitor is electrically connected to said storage node.

51. The method of claim 49, further comprising:
forming a deep N-well region at least partially surrounding said memory cell.

52. An SRAM device comprising:
a memory cell comprising
a first cross-coupled inverter,
a second cross-coupled inverter electrically connected to said first cross-coupled inverter, wherein each inverter comprises
a pull down device, and
a pull up device electrically connected to said pull down device, and
a pass gate device electrically connected to said pull down device, wherein a channel width ratio of said pull up device to said pull down device is within a range of about 1.5 to about 0.8, and wherein a channel width ratio of said pull up device to said pass gate device is within a range of about 3.0 to about 1.2.

53. An SRAM device comprising:
a memory cell comprising
- a first cross-coupled inverter, and
- a second cross-coupled inverter electrically connected to said first cross-coupled inverter, wherein each inverter comprises
  - a pull down device, and
  - a pull up device electrically connected to said pull down device,
- a pass gate device electrically connected to said pull down device, wherein a channel area ratio of said pull up device to said pull down device is within a range of about 3 to about 1, and wherein a channel area ratio of said pull up device to said pass gate device is within a range of about 3.5 to about 1.25.

54. An SRAM device comprising:
a memory cell comprising
- a first cross-coupled inverter, and
- a second cross-coupled inverter electrically connected to said first cross-coupled inverter, wherein each inverter comprises
  - a pull down device, and
  - a pull up device electrically connected to said pull down device,
- a pass gate device electrically connected to said pull down device, wherein a channel width ratio of said pull up device to said pull down device is within a range of about 1.5 to about 0.8, wherein a channel width ratio of said pull up device to said pass gate device is within a range of about 3.0 to about 1.2, wherein a channel area ratio of said pull up device to said pull down device is within a range of about 3 to about 1, and wherein a channel area ratio of said pull up device to said pass gate device is within a range of about 3.5 to about 1.25.

* * * * *